(12) United States Patent
Rohleder et al.

(10) Patent No.: US 8,589,737 B2
(45) Date of Patent: Nov. 19, 2013

(54) MEMORY SYSTEM WITH REDUNDANT DATA STORAGE AND ERROR CORRECTION

(75) Inventors: Michael Rohleder, Unterschleissheim (DE); Gary Hay, Motherwell (GB); Stephan Mueller, Taunusstein (DE); Manfred Thanner, Neubiberg (DE)

(73) Assignee: Freescale Semiconductor, Inc., Austin, TX (US)

( * ) Notice: Subject to any disclaimer, the term of this patent is extended or adjusted under 35 U.S.C. 154(b) by 219 days.

(21) Appl. No.: 12/995,297

(22) PCT Filed: Jun. 20, 2008

(86) PCT No.: PCT/IB2008/052447
§ 371 (c)(1),
(2), (4) Date: Nov. 30, 2010

(87) PCT Pub. No.: WO2009/153623
PCT Pub. Date: Dec. 23, 2009

(65) Prior Publication Data
US 2011/0083041 A1   Apr. 7, 2011

(51) Int. Cl.
*G06F 11/00*   (2006.01)
(52) U.S. Cl.
USPC ............... 714/42; 714/4.2; 714/5.1; 714/6.1; 714/6.2; 714/6.23; 714/6.24
(58) Field of Classification Search
USPC ............. 714/4.2, 5.1, 6.1, 6.2, 6.23, 6.24, 42
See application file for complete search history.

(56) References Cited

U.S. PATENT DOCUMENTS

| | | | |
|---|---|---|---|
| 5,283,877 A | 2/1994 | Gastinel et al. | |
| 5,495,570 A | 2/1996 | Heugel et al. | |
| 5,619,642 A * | 4/1997 | Nielson et al. | 714/6.12 |
| 5,822,257 A * | 10/1998 | Ogawa | 365/200 |
| 5,905,854 A * | 5/1999 | Nielson et al. | 714/6.12 |

(Continued)

FOREIGN PATENT DOCUMENTS

| | | | |
|---|---|---|---|
| EP | 0709782 A | | 5/1996 |
| EP | 1054326 B1 | | 10/2003 |
| EP | 1703400 A | | 9/2006 |
| WO | 2009153624 A1 | | 12/2009 |

OTHER PUBLICATIONS

Lavoie Jeromie: "IBM Memory Expansion Technology" Weblink: http://www.research.ibm.com/journal/rd/452/tremaine.html, pp. 1-16.

Lai Anthony: "Mitigation Techniques for Electronics in Single Event Upset Environments" Weblink: www.mil-embedded.com/articles/authors/lai/, Jan. 25, 2006, pp. 1-8.

(Continued)

*Primary Examiner* — Charles Ehne

(57) ABSTRACT

A system comprises at least two random access memory (RAM) elements arranged to store data redundantly. The system further comprises RAM routing logic comprising comparison logic operably coupled to the at least two RAM elements and arranged to compare redundant data read from the at least two RAM elements, and check and validation logic, independent of the RAM routing logic, operably coupled to the at least two RAM elements and arranged to additionally detect an error in the redundant data read from the at least two RAM elements and provide an error indication signal to the RAM routing logic in response thereto. The RAM routing logic further comprises selection logic arranged to dynamically select redundant data from one of the at least two RAM elements based on the comparison of the redundant data and the error indication signal.

20 Claims, 3 Drawing Sheets

(56) References Cited

U.S. PATENT DOCUMENTS

| | | | |
|---|---|---|---|
| 6,510,527 B1 | 1/2003 | Woerner et al. | |
| 6,901,552 B1 | 5/2005 | Fey et al. | |
| 6,959,400 B2 | 10/2005 | Peleska | |
| 7,003,622 B2 * | 2/2006 | Shinohara et al. | 711/104 |
| 2003/0028710 A1 * | 2/2003 | Shinohara et al. | 711/104 |
| 2003/0107925 A1 * | 6/2003 | Koss et al. | 365/200 |
| 2005/0138465 A1 | 6/2005 | Depew et al. | |
| 2006/0218432 A1 | 9/2006 | Traskov et al. | |
| 2011/0082970 A1 * | 4/2011 | Rohleder et al. | 711/104 |

OTHER PUBLICATIONS

Tezzaron Semiconductor: "Soft Errors in Electronic Memory-A White Paper" Tezzaron Semiconductor, 1415 Bond Street, Suite 111, Naperville, IL, 60563, Version 1.1, Jan. 5, 2004, pp. 1-7.

Maiz Jose et al: "Characterization of Multi-bit Soft Error Events in Advanced SRAMs" IEEE International Electronic Device Meeting, Dec. 2003, pp. 519-522.

International Search Report and Written Opinion correlating to PCT/IB2008/052447 dated Mar. 10, 2009.

* cited by examiner

MEMORY SYSTEM WITH REDUNDANT DATA STORAGE AND ERROR CORRECTION

FIELD OF THE INVENTION

The field of this invention relates to a memory sub-system, and more particularly to a memory sub-system suitable for use in safety applications in order to provide a high availability of the stored memory contents with minimal resource requirements.

BACKGROUND OF THE INVENTION

Safety requirements for automotive electronics are being standardized in a number of application segments. An example of application segments includes chassis applications, which United States government legislation requires to be standardized for each new vehicle from 2012. A further example is electric power steering.

Automotive braking applications and steering applications also both require sophisticated electronic solutions that allow switching to a safe state in case a malfunction is detected. Accordingly, awareness of safety issues, for example by a system-on-chip (SoC), is of increasing importance in today's vehicular applications, although the usage of such devices is not limited to such applications. However, the safety level required differs from application to application. For example, some applications may require Safety Integrity Level (SIL) 3, whilst other applications may require SIL 2. Safety Integrity Levels are defined as a relative level of risk-reduction provided by a safety function, or as a specific target level for risk reduction. Four SIL levels are defined by the International Standard IEC 61508, ranging from SIL 4, being the most dependable, to SIL 1, being the least dependable.

Different levels of safety may require varying amounts of redundancy of building blocks and connectivity within the SoC. As a result of this, known SoCs are designed with a specific SIL in mind. However, the need to develop multiple SoC architectures to support multiple SILs makes the development of safety aware devices complex and costly.

One particular area of importance for such SoCs is the Random Access Memory (RAM) provided on the SoC, which is a major contributor for possible failure conditions within the performance of the SoC. Since redundancy of a building block such as RAM within SoCs is typically tightly coupled to the architecture of the SoC and the application intended to run thereon, this is an issue for creating a family of safety aware devices.

A significant factor in safety-related applications is to obtain a timely detection of system failures in order to avoid erroneous behaviour. In order to address such problems, it is important to identify a cause of such faults. However, it is known that in many cases the identification of a system failure requires switching to a safe state (usually a restart or shut-down of the faulty system). It is also known that the switch to a safe state results in a reduced availability of the system, which is undesirable. In this context, the expression 'availability of the system' may be considered as the degree to which a system is operable and in a committable state, when called for at an unknown time. Alternatively, system availability may be considered as the proportion of time that a system is in a fully-functioning condition (as defined in wikipedia.org).

As such, a system that provides increased safety or failure detection will usually provide decreased availability, when there are no further means to keep the system operable, even in cases when a fault has been detected. A common means to achieve increased safety or failure detection is to implement redundant sub-systems having a voting mechanism; where three or more elements are running in parallel. In case of a failure of an element in such a sub-system, a voting mechanism may be used to identify the faulty element and select a correct value from one of the other elements. However, it will be appreciated that replicating any sub-system three or more times is very expensive and is rarely used and only when it can be justified. As such, less costly implementations that are able to provide similar system availability are desirable.

EP1054326B1 discloses a memory error detection and correction mechanism that utilises sliced memory to store data and an X-ORed checksum for this data in an additional slice; an error correction code is used for every slice, while the X-ORed checksum is used to detect and correct errors in case of a defective slice.

SUMMARY OF THE INVENTION

Embodiments of the invention provide a system for distributing available memory, and a semiconductor device comprising such a system, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
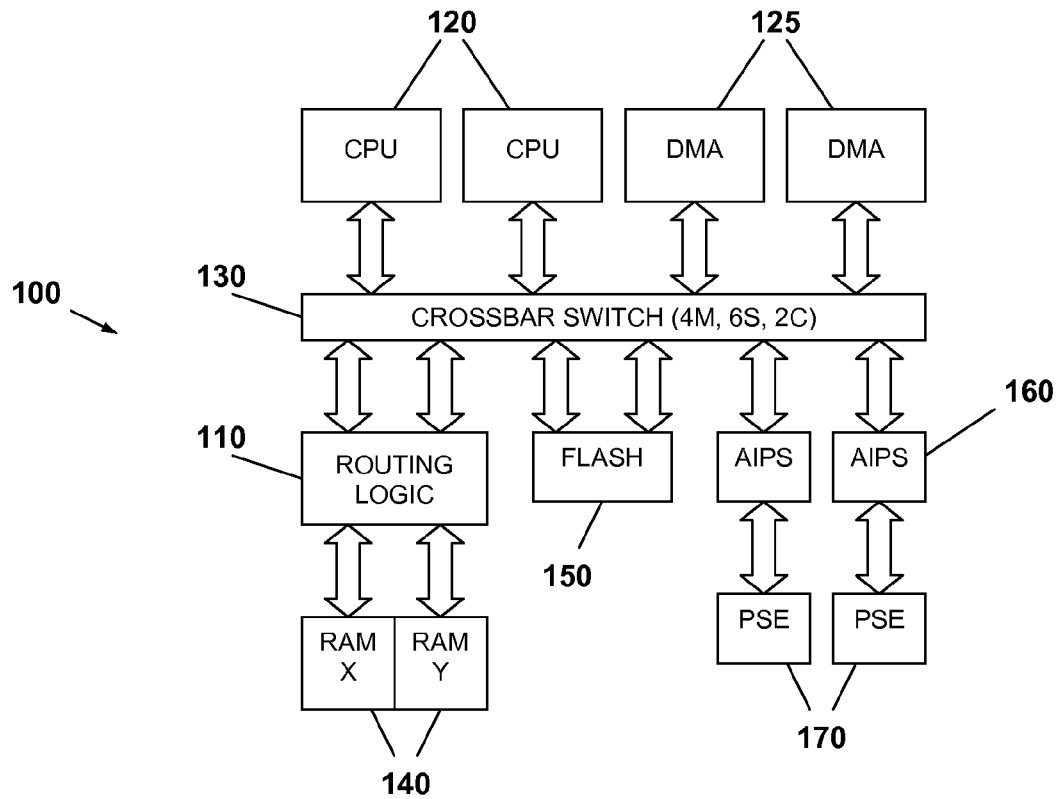
FIG. 1 illustrates system architecture according to an embodiment of the invention.

Embodiments of the invention will be described in terms of a memory interface for a random access memory (RAM), within a system-on-chip (SoC) comprising one or more bus master devices, and comprising a focus on safety aspects. Although embodiments of the invention will be described in terms of a system-on-chip (SoC), it will be appreciated that the inventive concept herein described may be embodied in any apparatus that incorporates a random access memory that can be accessed by one or more bus master devices.

Embodiments of the invention propose a system for safety applications providing increased availability. The system comprises at least two random access memory (RAM) elements, error detection or error correction logic for identifying and optionally correcting errors read from these RAM elements, and RAM routing logic. The RAM routing logic comprises configuration logic to dynamically identify a faulty RAM content and select a correct or corrected value.

System architectures for safety aware applications may consist of fully or nearly fully redundant systems, comprising two systems working concurrently in lock-step mode, whereby operations of the two systems are compared and validated on a cycle-by-cycle basis. Such system architectures perform two concurrent memory accesses, both systems addressing the same memory content, which is stored redundantly.

Alternatively, system architectures may provide multiple bus master elements, which may operate redundantly or independently with respect to one another, permitting a trade-off between safety and performance aspects. When operating redundantly, these system architectures may perform concurrent, redundant lock-step accesses as described above, or single accesses that are replicated externally to achieve a redundant storage. Accordingly, system architectures providing redundant storage may be required to support at least one from a group of:
  (i) Concurrent access by at least one bus master element to at least two memory elements to access redundantly stored data;
  (ii) Concurrent access by at least two bus master elements, operating redundantly with respect to one another, to at least two memory elements to access redundantly stored data.

Besides replication or redundancy of memory contents, the most common means to detect and remove errors in the content of memory elements is to use either or both of error-detecting codes (EDC), and error-correcting codes (ECC). EDC and ECC are both known to use code checking mechanisms, such as a cyclic redundancy check (CRC) checksum, where the CRC checksum is stored along with the actual data, to identify (and sometimes correct) erroneous data content. Most codes can only correct a certain number of bit errors and only detect a further numbers of bit errors. The correct value is then forwarded to the requestor of this information. In a case where no additional information is available, an error message can be provided to the requesting device. When there is no error, the matching data is forwarded to the requestor as is.

Referring now to FIG. 1, there is illustrated system architecture 100 according to an embodiment of the invention. The system architecture 100 comprises bus master elements which for the embodiment illustrated in FIG. 1 are in a form of Central Processing Units (CPU) 120 and Direct Memory Access (DMA) controllers 125. The system architecture 100 further comprises a communication element, which for the illustrated embodiment is in a form of a crossbar switch 130, arranged to operably couple CPUs 120 and DMA controllers 125 to a plurality of slave elements. For the embodiment illustrated in FIG. 1, the system architecture 100 comprises slave elements in a form of Random Access Memory (RAM) elements 140, FLASH memory elements 150, and a bus bridge 160, via which peripheral slave elements 170 may be operably coupled to the bus master elements over the crossbar switch 130. As will be appreciated by a skilled artisan, a bus bridge 160 is only required when the communication protocol used by the crossbar switch 130, and the protocol used by the peripheral slave elements 170, do not match. In this manner, the bus bridge 160 may be omitted when both master and peripheral slave elements use the same protocol, although this is rarely the case.

The system further comprises RAM routing logic 110, operably coupled between the crossbar switch 130 and the RAM elements 140. The RAM routing logic 110 is arranged to operable couple both RAM resources to provide a redundant memory storage capable of dynamically identifying a faulty RAM content and select the correct or a corrected value when reading from the redundant memory blocks.

Figure 2:
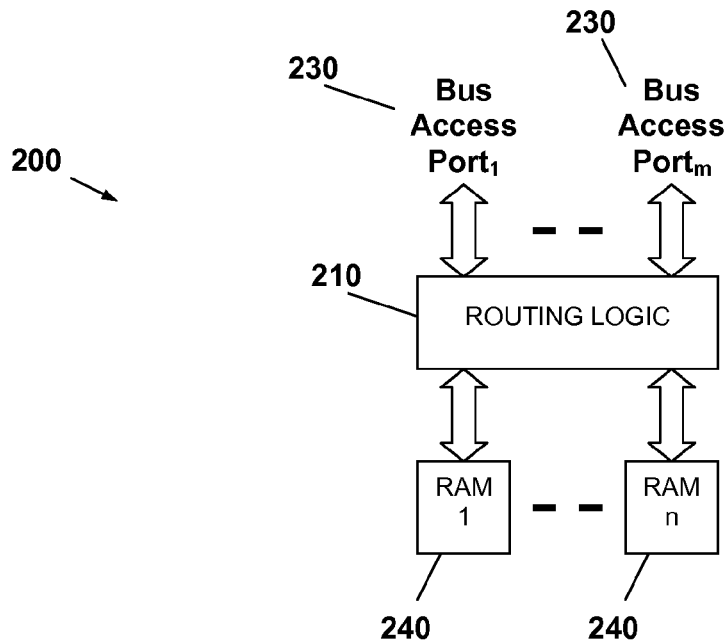
FIG. 2 illustrates a system for distributing available memory resource according to some embodiments of the invention.

FIG. 2 illustrates a system 200 for distributing available memory resource according to some embodiments of the invention. The system comprises at least two random access memory (RAM) elements 240, and RAM routing logic 210 arranged to dynamically distribute the available memory resource into a first and a second memory area providing non-redundant memory storage. RAM routing logic 210 further provides error detection and correction logic having superior detection capabilities to known art while enabling a high data availability. The RAM routing logic 210 is operably coupled to one or more bus access ports 230 of, for example, a crossbar switch or other communication element via which master elements may access the RAM elements 240. As will be appreciated by a skilled artisan, such a RAM routing logic 210 can be built supporting nearly arbitrary amounts of 'm' bus access ports 230 and 'n' random access memory (RAM) elements; where 'm' and 'n' can be differing numbers.

Figure 3:
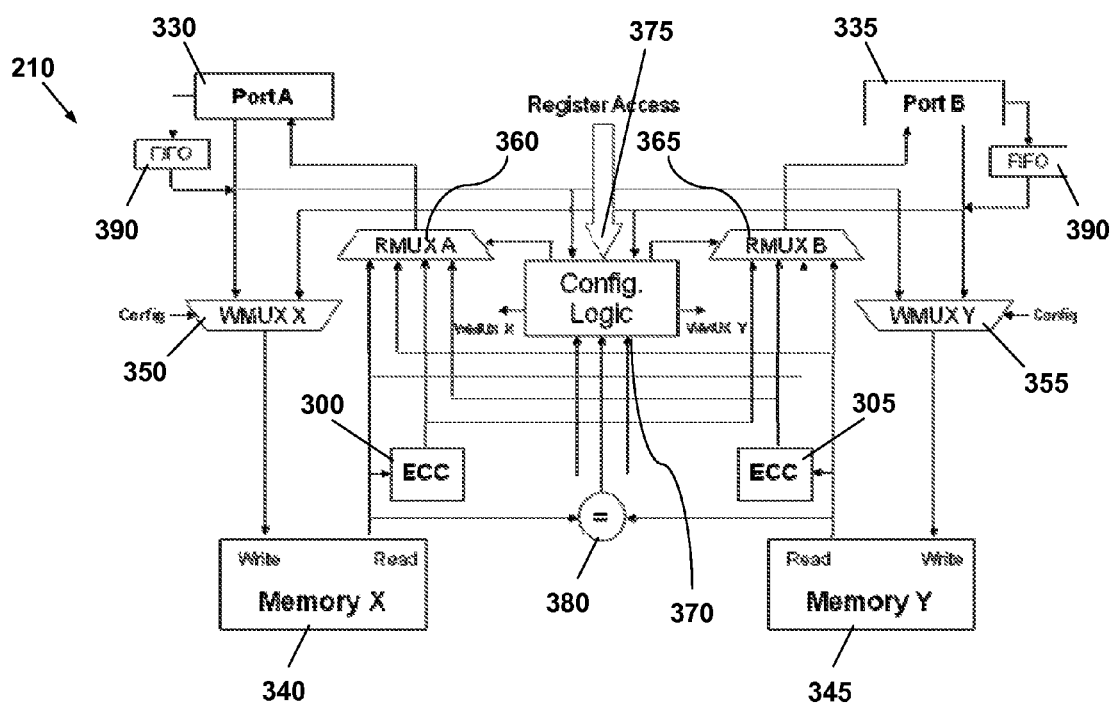
FIG. 3 illustrates a RAM routing logic according to some alternative embodiments of the invention.

Referring now to FIG. 3, there is illustrated RAM routing logic 210 supporting two Bus Access Ports and two random access memory (RAM) elements in greater detail according to some embodiments of the invention. For the embodiment illustrated in FIG. 3, the RAM routing logic 210 is operably coupled to a first bus access port, Port 'A' 330, and a second bus access port, Port 'B' 335, of a communication element such as a crossbar switch or the like. The RAM routing logic 210 is further operably coupled to two memory elements, Memory 'X' 340 and Memory 'Y' 345.

The RAM routing logic 210 comprises two write multiplexers, WMUX 'X' 350 and WMUX 'Y' 355. An output of each of the write multiplexers, WMUX 'X' 350 and WMUX 'Y' 355, is operably coupled to a write port of one of the memory elements, Memory 'X' 340 and Memory 'Y' 345 respectively. In this manner, the RAM routing logic 210 comprises a write multiplexer for each memory element coupled thereto. An output of each of the bus access ports, Port 'A' 330 and Port 'B' 335, is operably coupled to an input of each write multiplexer, WMUX 'X' 350 and WMUX 'Y' 355.

The RAM routing logic 210 further comprises two read multiplexers, RMUX 'A' 360 and RMUX 'B' 365. An output of each of the read multiplexers, RMUX 'A' 360 and RMUX 'B' 365, is operably coupled to an input of one of the bus access ports, Port 'A' 330 and Port 'B' 335 respectively. In this manner, the RAM routing logic 210 comprises a read multiplexer for each bus access port coupled thereto. A read port of each of the memory elements, Memory 'X' 340 and Memory 'Y' 345, is operably coupled to an input of each read multiplexer, RMUX 'A' 360 and RMUX 'B' 365.

The RAM routing logic 210 comprises configuration logic 370, arranged to dynamically distribute available memory resource into a first memory area providing redundant memory storage and a second memory area providing non-redundant memory storage. Accordingly, for the embodiment illustrated in FIG. 3, the configuration logic 370 is operatively coupled to, and arranged to control the configuration of, each of the read multiplexers, RMUX 'A' 360 and RMUX 'B' 365, and the write multiplexers, WMUX 'X' 350 and WMUX 'Y' 355. The configuration logic 370 is further operatively coupled to the outputs of the bus access ports, Port 'A' 330 and Port 'B' 335, and arranged to receive memory access request information therefrom. In this manner, the configuration logic 370 receives information relating to access requests, such as read and write requests, received on Port 'A' 330 and Port 'B' 355, and is able to dynamically configure the multiplexers 350, 355, 360, 365 in response to received access requests, and in accordance with, for example, an operating mode in which the RAM routing logic 210 has been configured to operate. For this purpose, the behaviour of the configuration logic 370 may be controlled by software, for example by altering internal registers (not shown) within the configuration logic 370 via a register access port 375.

For the illustrated embodiment, the RAM routing logic 210 further comprises comparator logic 380, operably coupled to the read ports of the memory elements, and arranged to compare information accessed from the memory elements. An output of the comparator logic 380 is provided to the configuration logic 370. In this manner, the comparison logic 380 is able to provide an indication to the configuration logic 370 in response to determining that the comparison of accessed information does not yield a match.

For the embodiment illustrated in FIG. 3, the RAM routing logic 210 further comprises error detection or correction logic, which for the illustrated embodiment is in the form of Error Correction Code (ECC) components 300, 305 operably coupled to the read ports of the memory elements 340, 345, and arranged to provide error detection and/or correction capabilities for data read from the memory elements 340, 345. The ECC components 300, 305 are further coupled to the configuration logic 370, and arranged to at least indicate to the configuration logic when an error has been detected in the corresponding data that has been read.

As will be appreciated, ECC components are often used in a form of ECC generation and checking components. In case of the embodiment illustrated in FIG. 3, it is sufficient to use ECC checking components; since it is assumed that the ECC syndrome is generated and stored outside of the RAM routing unit 210, because this will provide also improved error coverage for the outside connectivity. However, a person skilled in the art will recognize that it is also possible to use an ECC generation logic at multiple places within the RAM routing unit 210 (for example at a Bus Access Port or between a WMUX and the write port of the memory blocks) in order to generate the required ECC syndrome to be stored within the memory block.

As will be appreciated, a bus master element that is writing data, etc. to memory, may generate ECC information for that data that is being written, which may be added to the information within a write request. This ECC information may then be routed through, for example, the cross bar switch (for example cross bar switch 130 of FIG. 1) and, for the illustrated embodiments, RAM routing logic 210, before being received by the appropriate memory element. The ECC information is then stored in memory along with the corresponding data.

It is envisaged in a further embodiment of the invention that only error detection components (EDC) may be used instead of the ECC blocks shown in FIG. 3, which are able to 'detect' and 'correct' errors. This will result in a somewhat reduced system capability, since a class of errors can not be corrected by such a system. The embodiment shown in FIG. 3 uses error detection and correction blocks 300, 305, since there are minimal savings to be gained from using EDC instead of ECC blocks.

For the illustrated embodiment, ECC components 300, 305 are attached to buses or the like, as opposed to being provided by the memory elements themselves.

As previously mentioned, the RAM routing logic 210 comprises comparator logic 380 operably coupled to the read ports of the memory elements 340, 345, and arranged to compare information read from the memory elements. An output of the comparator logic 380 is provided to the configuration logic 370. Accordingly, when reading redundantly stored information, the information retrieved from both memory elements 340, 345 is compared by comparator logic 380. In this manner, the comparator logic 380 provides a means of validating data read from the two memory elements 340, 345 relative to one another. Although the embodiment in FIG. 3 illustrates a direct connection between the read ports of the memory and the ECC units 300, 305 and comparator 380, it is envisaged that in alternative embodiments an indirect connection may be used, say via another element or component.

Accordingly, for the embodiment illustrated in FIG. 3, when the data is subsequently read from memory, the data and its corresponding ECC information are provided to the ECC components 300, 305 coupled to the memory element 340, 345. The ECC components 300, 305 then perform ECC checking on the data and ECC information is used to detect, and if possible correct, any errors that may have occurred during conveyance or storage of the data. In this manner, the ECC components 300, 305 provide additional safety features for data stored within memory.

As previously mentioned, the ECC components 300, 305 are arranged to detect, and if possible correct, errors within information read from the memory elements 340, 345. However, as will be appreciated, not all errors can be corrected using such ECC components. Nevertheless, when the RAM routing logic 310 is configured to provide concurrent access to the two memory elements 340, 345 providing redundant memory storage, the comparator logic 380 is able to detect when information read from the memory elements does not match. Accordingly, when the information read does not match, the ECC components 300, 305 are capable of detecting which information is erroneous.

Consequently, even if the ECC components 300, 305 detecting the error are unable to correct the data in error, the configuration logic 370 is able to identify which of the redundantly stored information is error free (or can be corrected in case of a single bit error), and thereby route that information back to the requestor. Accordingly, unless errors are detected within both sets of read information, the RAM routing logic 310 is able to effectively correct information comprising any number of bit errors detected in one of the memory elements when configured to provide concurrent access to the two memory elements 340, 345 providing redundant memory storage. In this manner, further safety is provided with respect to the storage and retrieval of information within a system configured to provide redundant memory storage.

Figure 4:
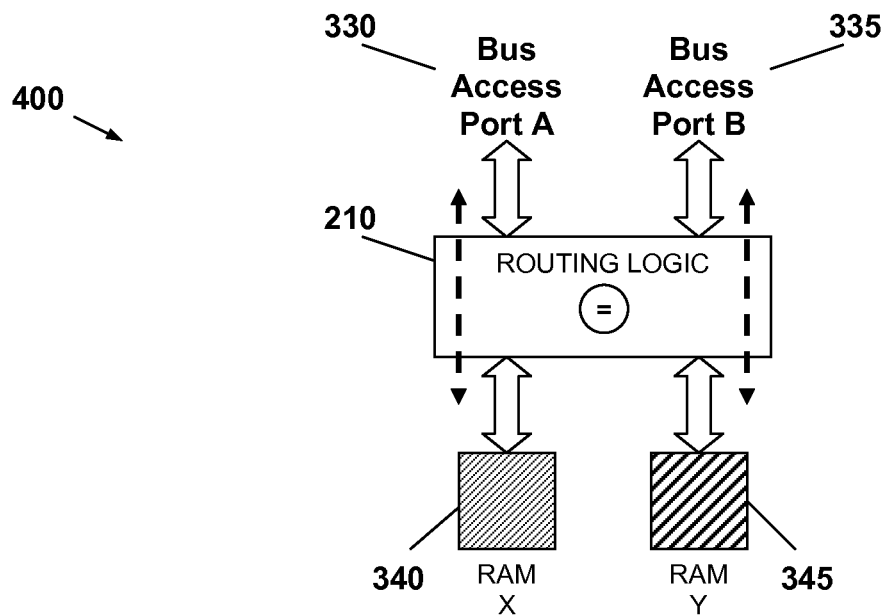
FIG. 4 and FIG. 5 illustrate data flow configurations of the RAM routing logic of the system in accordance with some embodiments of the invention.

Referring now to FIG. 4, there is illustrated the RAM routing logic 210 configured to support concurrent access to the two memory elements 340, 345 via the two bus access ports, Port A 330 and Port B 335, to access redundantly stored data. For example, bus master elements, such as CPUs 120, may be configured to operate in 'lock-step', whereby the master elements perform equivalent operations, cross-checking each other's operations. Thus, concurrent accesses are performed via the two respective bus access ports 330, 335. In this configuration, redundancy may be provided for both bus master resources and memory resources, thereby providing a high safety level throughout the system.

For the operation illustrated in FIG. 4, the RAM routing logic 210 concurrently receives separate but equivalent read and write requests for the memory elements, Memory X 340 and Memory Y 345, via bus access ports, Port A 330 and Port B 335 respectively. The access requests may be validated to be equivalent, and corresponding accesses may then be performed by the RAM routing logic 210 to the two memory elements 340 and 345 concurrently, resulting in redundant storage of data in the two memory elements 340, 345. For this purpose, the first bus master element reads and writes to Memory X 340 via Port A 330, whilst the second bus master element performs corresponding read and write operations to Memory Y 345 via Port B 335.

Referring back to FIG. 3, when the RAM routing logic 210 is operating to provide redundant memory storage in a redundantly working system as illustrated in FIG. 4, the configuration logic 370 configures WMUX X 350 and RMUX A 360 to operably couple the output and input of Port A 330 to the write and read ports of Memory X 340 respectively, as required for write and read requests received on Port A 330. Similarly, the configuration logic 370 configures WMUX Y 355 and RMUX B 365 to operably couple the output and input of Port B 335 to the write and read ports of Memory Y 345 respectively, as required for write and read requests received on Port B 335. In this manner, Port A 330 provides access exclusively to Memory X 340, whilst Port B 335 provides access exclusively to Memory Y 345. Thus, since the master elements are operating in lock-step, and thereby executing the same instructions, the same information will be written to, and read from, the memory elements 340, 345 consecutively. As a result, the memory elements 340, 345 provide redundant storage for the data provided by the system.

In accordance with some embodiments of the invention, the configuration logic 370 may validate that the access requests received at both bus access ports 330 and 335 are equivalent. Accordingly, the RAM routing logic 210 may provide an error status to, say, the master element from which the, or each, access request originated when the access requests do not match, enabling the system to react properly on such an error condition. For example, the configuration logic 370 may generate an access error signal, provided for within the system bus functionality.

As previously mentioned, for the embodiment illustrated in FIG. 3, the RAM routing logic 210 comprises comparator logic 380, operatively coupled to the read ports of each memory element. Accordingly, in case of read operations from the memory elements 340, 345, when the RAM routing logic 210 is providing redundant memory storage as illustrated in FIG. 4, the comparator logic 380 compares the information read from the memory elements 340, 345. If the information does not match, an error has occurred in one or both of the memory elements, and a corresponding indication is returned to the configuration logic 370. Accordingly, upon detection of an error, the configuration logic 370 uses the status information provided by the comparator logic 380 and the EDC/ECC units 300, 305 to identify which of the data being read is erroneous and selects the correct value to be forwarded. In cases where ECC units 300 and 305 are used, it is further possible to select not only the data read but also corrected values from both memories by adding two more ports to the RMUX 360 and 365, which are then connected to the ECC units. This is especially useful in cases where both data words read are erroneous and at least one of both can be corrected by the ECC unit.

Figure 5:
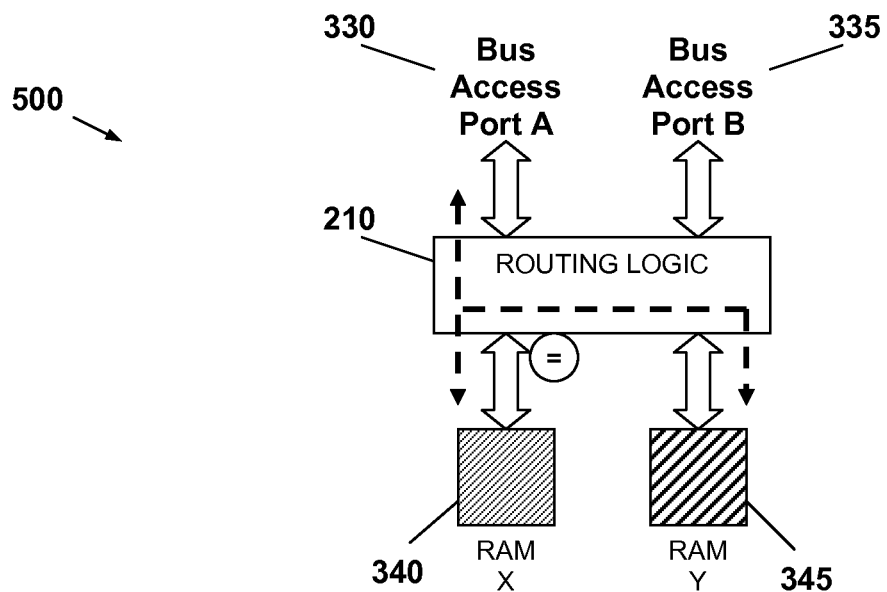

Referring now to FIG. 5, there is illustrated the RAM routing logic 210 configured to support concurrent access to the two memory elements 340, 345 via one bus access port, Port 'A' 330, to access redundantly stored data. For example, two bus master elements, such as CPUs 120, may be configured to operate independently, thus enabling to double the available operating performance thereof, Port 'A' 330. In this configuration, no redundancy is provided for bus master resources, or redundancy may be provided by other means than concurrent bus master accesses. However, redundant storage of data in duplicated memory resources is provided, thereby providing a high safety level at least for the data being stored in memory.

For the operation illustrated in FIG. 5, a single access request is received by the RAM routing logic 210 at bus access Port 'A' 330; in this example the second bus access Port 'B' 335 is not used or might be performing another operation. Since in this example the RAM routing logic 210 is providing redundant memory, it will subsequently perform concurrent accesses to the two memory elements 340, 345. For this purpose, when operating to provide redundant memory storage in this manner, the RAM routing logic 210 replicates access requests to both memory elements 340, 345; and the result of read requests to both memory elements 340, 345 may be validated to match to ensure the integrity of the data retrieved.

Referring back to FIG. 3, when the RAM routing logic 210 is operating to provide redundant memory storage as illustrated in FIG. 5, when an access request is received on Port 'A' 330, the configuration logic 370 configures WMUX 350 and WMUX 355 to couple respectively the output of Port 'A' 330 to both Memory 'X' 340 and Memory 'Y' 345. In this manner, when a write request is received at Port A 330, WMUX 350 and WMUX 355 route the write request to both memory elements 340 and 345 respectively. Thus, information is written to both memory elements, providing redundancy thereof. Conversely, when a read request is received on Port 'A' 330, the configuration logic 370 configures WMUX 350 and WMUX 355 to couple the output of Port 'A' 330 to the memory elements 340 and 345 respectively. As a result, both memory elements 340 and 345 provide the requested data on their respective read ports.

The configuration logic 370 validates that the data provided by both memory elements 340 and 345 at the respective read port is equivalent by evaluating the comparison result provided by the comparator logic 380. When the data matches, the configuration logic couples the read port of one memory element 340, 345 to the RMUX associated with the bus access port that has provided the original request by a bus master; for this particular example the bus access port A 330 and the RMUX 360.

Accordingly, upon detection of an error, the configuration logic 370 uses the status information provided by the comparator logic 380 and the EDC/ECC units 300, 305 to identify which of the data being read is erroneous and selects the correct value to be forwarded. In cases where ECC units 300 and 305 are used, it is further possible to select not only the data read but also corrected values from both memories by adding two more ports to the RMUX 360 and 365, which are then connected to the ECC units. This is especially useful in cases where both data words read are erroneous and at least one of both can be corrected by the ECC unit.

Error detection and correction using ECC units based on CRC syndromes is widely used to increase the availability of memory contents in case of failures; it is a relatively inexpensive technique to use, but does have limited error correction capabilities. Redundant memory, and especially triple voting, has superior error detection capabilities; but only triple-voting is capable of correcting most of the detected errors. However, redundant memory is an expensive feature, especially when combined with triple voting where triple the amount of memory is needed, which is very likely the reason why triple voting is typically only used for mission-critical systems.

A person skilled in the art will appreciate that embodiments of the invention provide similar error correction capabilities to a triple voting memory architecture, for the most common failure types, at much lower cost. The skilled artisan will also appreciate that embodiments of the invention further provide better detection and correction capabilities for the less common failure types. Embodiments of the invention does this by combining two memory blocks, which are storing the corresponding data values redundantly, with a second, different error detection mechanism. In one embodiment, the second error detection mechanism is an ECC unit based on a CRC syndrome for every memory element, which not only provides error detection, but additionally provides some further error correction capabilities. This second error detection mechanism is used by a routing element to identify the memory element holding the correct data value in a case of an error condition. For this purpose, each ECC unit provides some error indication; it may further provide a corrected data value in cases of a single bit error in the corresponding memory element, which is a second set of inputs handled by the routing element in one embodiment.

As a result the routing element is able to choose between four different data values, dependent on error indication information from the ECC units:
 (i) Original value from the first redundant memory
 (ii) Corrected value from the first redundant memory
 (iii) Original value from the second redundant memory
 (iv) Corrected value from the second redundant memory An additional comparator may be used to compare both original values read from the redundant memory blocks and provide a match indication to the control element of the routing element. This control element is arranged to evaluate the match indication and the error indication(s) from the ECC units and determines which of the above inputs provides a correct data value. The corresponding value is then selected and forwarded to the requesting bus access port. A skilled artisan will appreciate that the usage of the corrected values is optional and can be omitted.

The usage of ECC units that can also correct erroneous data being read is beneficial, because it will also permit error correction using solely the ECC capabilities in a case of non-redundant storage of information. This is envisaged as being an important feature when the used memory elements provide a flexible trade-off between redundant memory that provides a high availability of the stored information for redundant memory elements and non-redundant storage that may be used for less critical data that is still guarded by the ECC scheme (as described in Applicant's co-pending PCT application, filed on the same day as the present application with ref: TS48207EH). As such the ECC protection of each redundant memory block will also be appreciated when using both memories independently.

Compared to known techniques for implementing redundant memories while preserving the availability (e.g. triple voting, as described in "Mitigation techniques for electronics in Single Event Upset environments", see http://www.mil-embedded.com/articles/authors/lai/), embodiments of the invention provide a superior solution that requires less space (double memory vs. triple memory), whilst providing better results and better availability. It is noteworthy that in contrast to the embodiments described herein, a triple voting memory such as the one described in the above article will not be able to identify the correct value in case of erroneous data in two memories, or may even select the wrong data in a case where the same error exists in two memories.

The following table compares the error detection and correction capabilities of embodiments (identified as column: EMB) of the invention, with the corresponding capabilities of other state-of-the-art methods:
 a single RAM memory protected by a ECC scheme based on CRC (identified as column: ECC),
 duplicated memory blocks storing the data redundantly (identified as column: RED), and
 a triple voting redundant memory architecture (identified as column: TRV)

All possible error classes are described and enumerated (OK, E1-E3, S1-4, B1-5) for later discussion; along with some information about the probability of the corresponding class, which is required for an appropriate classification of the detection/correction capabilities. The column X=Y provides some less granular classification based on comparing the content of a single word in two memory elements storing data redundantly. Error classes that can not be distinguished or do not apply for a specific methodology are combined to provide an appropriate classification.

TABLE 1

| Case | X = Y | Failure description | Probability | ECC | RED | TRV | EMB |
|---|---|---|---|---|---|---|---|
| OK | | No failure | | ✓ | ✓ | ✓ | ✓ |
| E1 | read data matches | (Same) single bit error in both memories | $<P_{1bit}^2 * P_{same}$ | ☺ | ⊗ | ☒ | →✓ ℞ |
| E2 | | (Same) double or multi-bit error in both memories; CRC syndrome does NOT match the one of the correct data | $<P_{2bit}^2 * (1-P_{match}) * P_{same}$ | | | | |
| E3 | | (Same) double or multi-bit error in both memories; CRC syndrome DOES match the one of the correct data | $<P_{2bit}^2 * P_{match} * P_{same}$ | | | | ⊗ |
| S1 | read data differs, failure is located in a single memory | Single bit error in a single memory | $P_{1bit}$ | →✓ | ℞ | →✓ | →✓ |
| S2 | | Double bit error in a single memory | $P_{2bit}$ | | ℞ | | →✓ |
| S3 | | Multi-bit (>2) error in a single memory; CRC syndrome does NOT match the one of the correct data | $P_{nbit} * (1-P_{match})$ | | ℞ | | →✓ |
| S4 | | Multi-bit (>2) error in a single memory; CRC syndrome DOES match the one of the correct data | $P_{nbit} * P_{match}$ | | ⊗ | | ℞ |

TABLE 1-continued

| Case | X = Y | Failure description | Probability | ECC | RED | TRV | EMB |
|---|---|---|---|---|---|---|---|
| B1 | read data differs, failures are located in both memories | (Different) single bit error in both memories | $<P_{1bit}^2 * (1-P_{same})$ | ☺ | ℞ | ℞ | →✓ |
| B2 | | Single bit error in one memory, double bit error in the second memory | $<P_{1bit} * P_{2bit} * (1-P_{same})$ | | | | →✓ |
| B3 | | Single bit error in one memory, multi-bit (>2) bit error in the second memory, CRC syndrome does NOT match the one of correct data | $<P_{1bit} * P_{nbit} * (1-P_{match}) * (1-P_{same})$ | | | | →✓ |
| B4 | | Single bit error in one memory, multi-bit (>2) bit error in the second memory, CRC syndrome DOES match the one of correct data | $<P_{1bit} * P_{nbit} * P_{match} * (1-P_{same})$ | | | | ℞ |
| B5 | | (Different) double or multi-bit (>2) error in both memories | $<P_{2bit}^2 * (1-P_{same})$ | | | | ℞ |

Legend:  no failure  ✓
         Corrected  →✓
         Detected  ℞
         not detected  ☺
         wrong data selected  ☒
         not applicable  ⊕

The probabilities used in this table are:

$P_{1bit}$: probability of a single bit error in one word of a single memory element;

$P_{2bit}$: probability of a double bit error in one word of a single memory element;

$P_{nbit}$: probability of a multi bit (n>2) error in one word of a single memory element;

$P_{match}$: probability that the same error (of any above type) occurs in the same word in both memory elements;

$P_{same}$: probability of a multi bit (n>2) error where the calculated CRC syndrome of the erroneous word matches the CRC syndrome of the correct data.

Exact numbers for these probabilities are dependent on the technology used, memory size and type, and the used CRC syndrome. However, it is commonly understood that $P_{1bit}$ is significantly larger than $P_{2bit}$, which is again larger than $P_{nbit}$. As an example of these probabilities, a number of references, such as "Soft Errors in Electronic Memory—A White Paper" and located at www.tezzaron.com, describe SRAM's providing 200 to 2000 FIT/Mbit, whereas other references report SRAM's having 10.000 or 100.000 FIT. One FIT (Failure In Time) signifies one error in a billion ($10^9$) hours; therefore a FIT rate of 1000 is equivalent to Mean Time To Failure (MTTF) of 114 years ($=10^9/(1000\times24\times365)$). It will be appreciated that these numbers must always be adjusted according to the actual memory type and size being used. The probability of errors involving more than one bit is even smaller; typically 1% of recorded failures are double bit faults ($P_{2bit} \leq P_{1bit}/100$), and multi-bit faults even have a probability that is at least one magnitude smaller, as described in the document titled "Characterization of Multibit Soft Error Events in Advanced SRAMs", published in the Proc. IEEE Int'l Electronic Device Meeting, pp. 519-522 December 2003 and authored by J. Maiz, S. Hareland, K. Zhang, and P. Armstrong:

Furthermore, dependent on the chosen CRC syndrome, the probability $P_{same}$ is relatively small, and usually of magnitudes smaller than $P_{nbit}$. Finally the probability Pmatch of a common failure in the same word in both memories is very unlikely, of course dependent on the susceptibility of a device for common cause failures, which is a reason why it is often neglected in many safety discussions.

Based on the above probabilities for achieving a high availability, it is important to provide the correct or corrected data in cases having a reasonable high probability; which are basically the error classes S1, S2, and S3. As shown in the table, a memory guarded with ECC will already detect all failures in these classes, but is not capable of correcting the errors. This is a reason why triple voting memory architectures are often chosen for mission-critical systems, as they provide the correct value for all these error classes. Furthermore, in the case when an error results in the same CRC syndrome than the correct value (error class S4, which has a very low probability), an ECC protected memory will not be able to detect such a failure. This is highly undesirable for any safety architecture. The disclosed embodiment is able to correct all errors in the classes S1, S2, and S3 and is further capable to detect errors in the class S4; at a substantially lower cost than a triple voting architecture. It is known that a triple voting architecture is also able to correct errors in the class S4; however the probability of occurrences of these failures does not usually justify the extra cost and effort in supporting triple voting.

Triple voting memory architectures are very expensive, and can only detect errors, but not provide the correct value in cases of failure accumulation or common cause failures. Here the memories used are receiving a continuous stream of distortions or suffering from common cause failures (i.e. power rail distortion) that affect all underlying memories at the same time. Although the probability of these errors is rather small, they are of increasing importance, since the decreasing topologies of newer semiconductor material are increasing their likelihood of occurrence. Error classes resulting from these failures are covered in B1, B2, B3, and E1, and to a much smaller extent in the error classes B5 and E2. Redundant and even triple voting memory architectures will only be capable of detecting a certain amount of these errors, but can not correct any of them. Even worse redundant and triple voting memory architectures will select a wrong data value in case of the (already very low probability) cases E1 and E2.

In contrast, the embodiments described herein are able to correct the vast majority of these errors (classes B1, B2, B3, E1) and are further capable of detecting all other errors (classes B5 and E2); thus providing an improved availability at a substantially lower cost than a triple voting architecture.

The extremely low probability of the remaining two error classes E3 and B4 does not justify much attention, given the fact that they require errors in both memories that are showing exactly the same CRC syndrome than the correct data value. The disclosed embodiments will still be able to detect the majority of these failures (error case B4); only failures falling into the error case E3 can not be detected. Given the fact that the probability P2bit is often below the ppm range and Pmatch and Psame are usually much smaller, the probability of such an error is completely negligible.

Since memories guarded by ECC do not have a second RAM, the error classes E1-E3 and B1-B5 do not apply; thereby resulting in the probability of the corresponding S[1-4] case being increased.

Thus, the overview illustrated in table 1 shows that the embodiments of the invention provide an enhanced availability that achieves at least a performance equivalent to a triple voting architecture for all error cases, particularly those errors having a high probability (S1, S2, and S3) of occurrence at much lower cost. Embodiments of the invention further provide an improved availability for many other error cases (B1, B2, B3, and E1), and are able to detect errors in most cases where other error detection/correction methods are not capable of identifying a failure (e.g. S4 in a case of ECC) or even select erroneous data (e.g. E1, E2 in a case of triple voting).

This improved availability is provided without degradation of its error detection capabilities; embodiments of the invention are capable to detect every error case that is detectable by competing known technologies. In fact, in contrast to other described error detection methods, there is only a single error sub-class (E3), where the aforementioned embodiments of the invention are not able to detect the failure. Errors falling in this class have an extremely low probability ($P_{E3} < P_{2bit}^2 * P_{match} * P_{same}$)—even compared to the probability of other rare error classes, since it requires exactly the same multi-bit error to occur in the same word of both memory blocks. Furthermore, the CRC syndrome calculated from the erroneous data must match the original CRC syndrome stored with this data for both erroneous words. Thus, it will be appreciated from the above description that the probability of such an error is extremely low; e.g. when assuming $P_{2bit}=10^{-9}$, $P_{match}=10^{-7}$, and $P_{same}=10^{-8}$ the probability of such an error is less than $10^{-33}$.

Compared with prior art, there is a single error class having a very low probability of occurrence (S4), where triple voting memory architectures provide a higher availability, but notably at much higher cost and at the expense of reduced availability or detection performance in many other error classes that have a higher probability (B1, B2, B3, E1). Thus, the employed combination of different error detection and correction mechanisms within embodiments of the invention further improve the capability to detect or even correct errors resulting from common cause failures, which are of increasing concern for safety architectures.

Therefore, each error detection capability has its benefits; ECC provides a good coverage for a reasonable overhead in memory size and a small degradation in performance (due to the additional time needed for possibly correcting a value). Redundant memory has basically no performance impact and can also correct multi-bit errors, but requires more resources; it is further more receptive to common failures e.g. caused by power supply lines or electromagnetic distortion on common inputs. However, the embodiment described in the invention provides a beneficial combination of two rather different error detection mechanisms, where the detection capabilities of one mechanism compensate shortcomings of the other mechanism. It results in a memory architecture providing error detection for basically every possible error case, and is capable of correcting the vast majority of these errors. As such it provides a much better balance between error detection and correction capabilities than competing mechanisms.

Aspects of the invention may be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

As used herein, the term 'bus' is used to refer to a plurality of signals or conductors which may be used to transfer one.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Also for example, in one embodiment, the illustrated elements of system 200 are circuitry located on a single integrated circuit or within a same device. Alternatively, system 200 may include any number of separate integrated circuits or separate devices interconnected with each other. For example, memory elements 340, 345 may be located on a same integrated circuit as RAM routing logic 210 or on a separate integrated circuit or located within another peripheral or slave discretely separate from other elements of system 200. Also for example, system 200 or portions thereof may be soft or code representations of physical circuitry or of logical representations convertible into physical circuitry. As such, system 200 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements, for example, from computer readable media. Such computer readable media may be permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A system comprising:
   at least two random access memory (RAM) elements, each of the at least two RAM elements have a first portion to store data redundantly and a second portion to store data non-redundantly;
   RAM routing logic comprising comparison logic operably coupled to the at least two RAM elements and arranged to compare redundant data read from the first portions of the at least two RAM elements; and
   check and validation logic, independent of the RAM routing logic, operably coupled to the at least two RAM elements and arranged to additionally detect an error in the redundant data read from each of the at least two RAM elements and provide an error indication signal to the RAM routing logic in response thereto;
   wherein the RAM routing logic comprises selection logic arranged to dynamically select from the redundant data read from the first portions of the at least two RAM elements to be compared and corrected data stored in one of the at least two RAM elements based on a combination of a result of the comparison of the redundant data read from the first portions of the at least two RAM elements and at least one error indication signal by the independent check and validation logic.

2. The system of claim 1 wherein the independent check and validation logic uses a method for error detection that is capable to detect erroneous data read from one RAM element of the at least two RAM elements holding redundant and non-redundant information based on data solely read from this one RAM element.

3. The system of claim 2 wherein the one RAM element is divided into multiple portions that do not hold redundant information.

4. The system of claim 3 further comprising at least one bus access port such that the RAM routing logic is operably coupled between the at least one bus access port and the at least two RAM elements.

5. The system of claim 3 further comprising configuration logic operably coupled to the RAM routing logic such that the configuration logic dynamically configures the system to support at least one from a group of:
   (i) Concurrent access by at least one bus access port to the at least two RAM elements in order to access redundantly or non-redundantly stored data; and
   (ii) Concurrent access by at least two bus access ports, operating redundantly with respect to one another, to respective at least two RAM elements in order to access redundantly stored data.

6. The system of claim 2 further comprising at least one bus access port such that the RAM routing logic is operably coupled between the at least one bus access port and the at least two RAM elements.

7. The system of claim 2 further comprising configuration logic operably coupled to the RAM routing logic such that the configuration logic dynamically configures the system to support at least one from a group of:
   (i) Concurrent access by at least one bus access port to the at least two RAM elements in order to access redundantly or non-redundantly stored data; and
   (ii) Concurrent access by at least two bus access ports, operating redundantly with respect to one another, to respective at least two RAM elements in order to access redundantly stored data.

8. The system of claim 1 wherein the check and validation logic is implemented in a form of one from a group of: a cyclic redundancy check, CRC, error detection circuit, EDC, and an error detection and correction circuit, ECC.

9. The system of claim 1 further comprising at least one bus access port such that the RAM routing logic is operably coupled between the at least one bus access port and the at least two RAM elements.

10. The system of claim 9 wherein the RAM routing logic is operably coupled between at least two bus access ports and the at least two RAM elements, such that the RAM routing logic provides a means to validate and compare access data and properties for any RAM access when operating redundantly.

11. The system of claim 10 wherein the RAM routing logic is arranged to permit a replication of the redundant data, read from a RAM element or corrected redundant or non-redundant data provided by the check and validation logic, to the at least two bus access ports.

12. The system of claim 9 further comprising at least one bus access port wherein the RAM routing logic is operably coupled between the at least one bus access port and the at least two RAM elements, wherein the RAM routing logic enables a replication of the data to be written provided at a bus access port into at least two random access memory (RAM) elements.

13. The system of claim 9 further comprising configuration logic operably coupled to the RAM routing logic such that the configuration logic dynamically configures the system to support at least one from a group of:
   (i) Concurrent access by at least one bus access port to the at least two RAM elements in order to access redundantly or non-redundantly stored data; and
   (ii) Concurrent access by at least two bus access ports, operating redundantly with respect to one another, to respective at least two RAM elements in order to access redundantly stored data.

14. The system of claim 1 further comprising configuration logic operably coupled to the RAM routing logic such that the configuration logic dynamically configures the system to support at least one from a group of:
   (i) Concurrent access by at least one bus access port to the at least two RAM elements in order to access redundantly or non-redundantly stored data; and
   (ii) Concurrent access by at least two bus access ports, operating redundantly with respect to one another, to respective at least two RAM elements in order to access redundantly stored data.

15. The system of claim 14 wherein the RAM routing logic is arranged to permit a replication of the redundant data, read from a RAM element or corrected redundant or non-redundant data provided by the check and validation logic, to the at least two bus access ports.

16. The system of claim 14 wherein the RAM routing logic is operably coupled between at least two bus access ports and the at least two RAM elements, such that the RAM routing logic provides a means to validate and compare access data and properties for any RAM access when operating redundantly.

17. The system of claim 14 further comprising at least one bus access port wherein the RAM routing logic is operably coupled between the at least one bus access port and the at least two RAM elements, wherein the RAM routing logic enables a replication of the data to be written provided at a bus access port into at least two random access memory (RAM) elements.

18. The system of claim 1 wherein the RAM routing logic is capable of using additional information on at least one from a group of corrected redundant data, or the corrected data itself, as provided by the check and validation logic, and by the selection logic.

19. The system of claim 1 wherein, in response to determining that the redundant or non-redundant data provided from the respective at least two RAM elements can not be corrected, the RAM routing logic outputs a further error indication signal.

20. A semiconductor device comprising:
   at least two random access memory (RAM) elements, each of the at least two RAM elements have a first portion to store data redundantly and a second portion to store data non-redundantly;
   RAM routing logic comprising comparison logic operably coupled to the at least two RAM elements and arranged to compare redundant data read from the first portions of the at least two RAM elements; and
   check and validation logic, independent of the RAM routing logic, operably coupled to the at least two RAM elements and arranged to additionally detect an error in the redundant data read from each of the at least two RAM elements and provide an error indication signal to the RAM routing logic in response thereto;
   wherein the RAM routing logic comprises selection logic arranged to dynamically select from the redundant data read from the first portions of the at least two RAM elements to be compared and corrected data stored in one of the at least two RAM elements based on a combination of a result of the comparison of the redundant data read from the first portions of the at least two RAM elements and at least one error indication signal by the independent check and validation logic.

* * * * *